(12) United States Patent
Shigenobu et al.

(10) Patent No.: US 11,199,784 B2
(45) Date of Patent: Dec. 14, 2021

(54) EXPOSURE APPARATUS AND ARTICLE MANUFACTURING METHOD

(71) Applicant: CANON KABUSHIKI KAISHA, Tokyo (JP)

(72) Inventors: Atsushi Shigenobu, Utsunomiya (JP); Yutoku Yoshioka, Utsunomiya (JP); Masatoshi Shimazaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/872,623

(22) Filed: May 12, 2020

(65) Prior Publication Data

US 2020/0363734 A1 Nov. 19, 2020

(30) Foreign Application Priority Data

May 17, 2019 (JP) .............................. JP2019-093919

(51) Int. Cl.
*G03B 27/52* (2006.01)
*G03F 7/20* (2006.01)

(52) U.S. Cl.
CPC ................ *G03F 7/70866* (2013.01)

(58) Field of Classification Search
CPC .. G03F 7/705; G03F 7/70633; G03F 7/70783; G03F 7/70866; G03F 7/70875; G03F 7/70733; H01L 21/67248
See application file for complete search history.

(56) References Cited

U.S. PATENT DOCUMENTS

| 7,595,496 B2 | 9/2009 | Ottens |
| 8,164,736 B2 | 4/2012 | Shibazaki |
| 2005/0136346 A1 | 6/2005 | Ottens |
| 2019/0072857 A1 | 3/2019 | Kupers |
| 2020/0166854 A1 | 5/2020 | Yagubizade |

FOREIGN PATENT DOCUMENTS

| JP | H06181168 A | 6/1994 |
| JP | H09251941 A | 9/1997 |
| JP | H10189424 A | 7/1998 |

(Continued)

OTHER PUBLICATIONS

Machine translation of JPH06181168, Jun. 1994.*

(Continued)

*Primary Examiner* — Peter B Kim
(74) *Attorney, Agent, or Firm* — Rossi, Kimms & McDowell LLP

(57) ABSTRACT

An exposure apparatus that performs a job process of exposing each of a plurality of substrates while exchanging the substrate is provided. The apparatus comprises a substrate holder configured to hold a substrate, and a controller configured to control the job process. The controller corrects, based on a relationship between an elapsed time of the job process and a substrate deformation amount, an overlay error generated due to deformation of the substrate, and exposes the substrate. In the relationship, the substrate conveyed to the substrate holder upon a substrate exchange is given an initial deformation amount corresponding to residual heat of the substrate holder at the time of the substrate exchange.

17 Claims, 4 Drawing Sheets

EMBODIMENT

(56) References Cited

FOREIGN PATENT DOCUMENTS

| JP | 4444812 B2 | 3/2010 |
|---|---|---|
| JP | 5555983 B2 | 7/2014 |
| WO | 2019034342 A1 | 2/2019 |

OTHER PUBLICATIONS

"GPU-accelerated feed-forward control", Research Disclosure, Dec. 2018: pp. 1320 vol. 656, No. 55. Cited in NPL 2.
Extended European Search Report issued in European Appln. No. 20172109.9 dated Oct. 9, 2020.
Search Report and Written Opinion issued in SG Appln. No. 10202004559T dated Dec. 30, 2020.

\* cited by examiner

EMBODIMENT

RELATED ART

EXPOSURE APPARATUS AND ARTICLE MANUFACTURING METHOD

BACKGROUND OF THE INVENTION

Field of the Invention

The present invention relates to an exposure apparatus and an article manufacturing method.

Description of the Related Art

One of the important performances of an exposure apparatus that projects and exposes the pattern of an original onto a substrate is the overlay accuracy of respective patterns transferred to the substrate through a plurality of steps. When exposure is repeated in the exposure apparatus, a substrate or a substrate holder is heated by absorbing a part of the energy of exposure light and the substrate is thermally expanded. This can cause a decrease in overlay accuracy.

To cope with this, a technique for compensating for a fluctuation of the overlay accuracy due to irradiation of the substrate or substrate holder with exposure light has been proposed. For example, Japanese Patent No. 5555983 discloses a fluctuation model of an overlay error such as a substrate magnification during exposure. In Japanese Patent No. 5555983, in order to improve the accuracy of the model, overlay errors are measured by an alignment scope before and after exposure to obtain the variation amount of the substrate, and the model is calibrated based on the variation width. However, the deformation amount of the substrate is difficult to predict since it is determined by various variables such as the exposure angle of view, the order of exposure, and the exposure amount. On the other hand, Japanese Patent No. 4444812 discloses a method in which a substrate is divided into minute regions, and the deformation amount of the substrate due to exposure is predicted by a minute region overlay model.

Along with the recent progress in miniaturization and high integration of semiconductor devices, further improvement in overlay accuracy of an exposure apparatus is required. Therefore, there is a need for further advanced compensation for a fluctuation of the overlay accuracy due to thermal deformation of a substrate.

SUMMARY OF THE INVENTION

The present invention provides a technique advantageous in terms of robustness of overlay accuracy against thermal deformation of a substrate.

The present invention in its one aspect provides an exposure apparatus that performs a job process of exposing each of a plurality of substrates while exchanging the substrate, comprising a substrate holder configured to hold a substrate, and a controller configured to control the job process, wherein the controller corrects, based on a relationship between an elapsed time of the job process and a substrate deformation amount, an overlay error generated due to deformation of the substrate, and exposes the substrate, and wherein in the relationship, the substrate conveyed to the substrate holder upon a substrate exchange is given an initial deformation amount corresponding to residual heat of the substrate holder at the time of the substrate exchange.

Further features of the present invention will become apparent from the following description of exemplary embodiments (with reference to the attached drawings).

DESCRIPTION OF THE EMBODIMENTS

Figure 1:
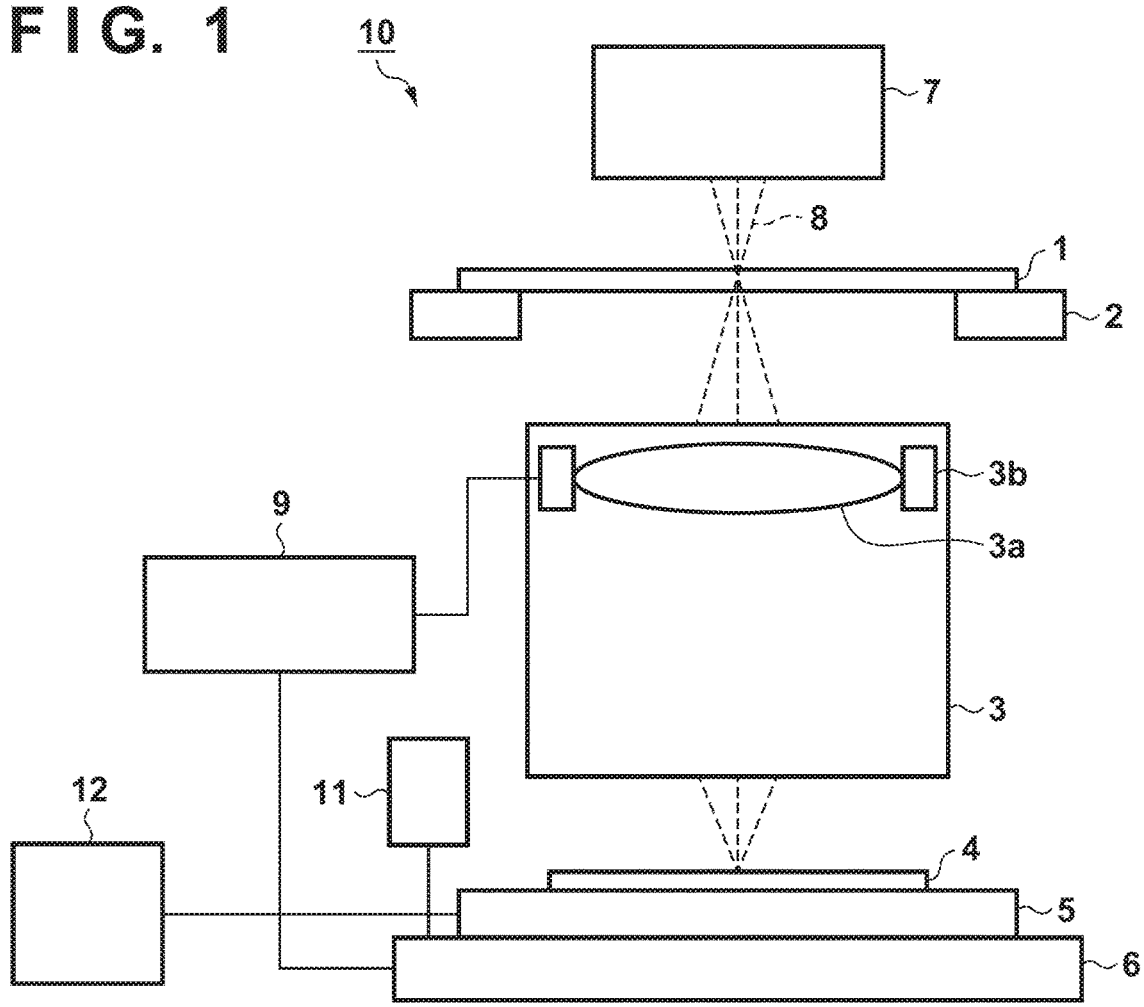
FIG. 1 is a view showing the arrangement of an exposure apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a view showing the arrangement of an exposure apparatus 10 according to an embodiment. The exposure apparatus 10 can include, for example, an original stage 2 that holds an original 1 (mask or reticle), a projection optical system 3, a substrate 4, a substrate holder 5 (substrate chuck), a substrate stage 6, an illumination optical system 7, and a controller 9. The substrate stage 6 is configured to support the substrate holder and be movable with the substrate holder 5. The controller 9 controls respective units of the exposure apparatus 10. The controller 9 includes, for example, a CPU, a memory, and the like, and controls processing of transferring the pattern of the original 1 to a shot region of the substrate 4.

The illumination optical system 7 illuminates the original 1 held by the original stage 2. More specifically, the illumination optical system 7 shapes light emitted from a light source using a light shield member such as a masking blade, and illuminates a pattern region (a region with a pattern formed therein) of the original 1 with the shaped light. As the light source, an ultra-high pressure mercury lamp, a solid-state light source such as an LED, an excimer laser, an EUV light source, or the like can be used. The original 1 is held by the original stage 2, and the substrate 4 is held by the substrate stage 6 (via the substrate holder 5). At this time, the original 1 and the substrate 4 are respectively arranged at optically almost conjugate positions (the object plane and image plane of the projection optical system 3) via the projection optical system 3. The projection optical system 3 projects the pattern of the original 1 onto the substrate 4 (a shot region thereof). The projection optical system 3 can include an optical element 3a and a driver 3b that drives the optical element 3a. In addition, the exposure apparatus 10 includes a measurement device 11 that measures the temperature of the substrate 4 or the substrate holder 5, and an adjustment device 12 that adjusts the temperature of the substrate holder 5. The measurement device 11 may include an infrared camera or the like for measuring the temperature of the substrate, or may include a sensor for measuring the temperature of cooling water cooling the substrate holder 5.

The exposure apparatus 10 can perform a job process in which exposure is sequentially performed on each of a plurality of substrates (for example, substrates of one lot) while exchanging the substrate via a substrate conveying mechanism (not shown). The controller 9 controls such a job process.

Figure 3:
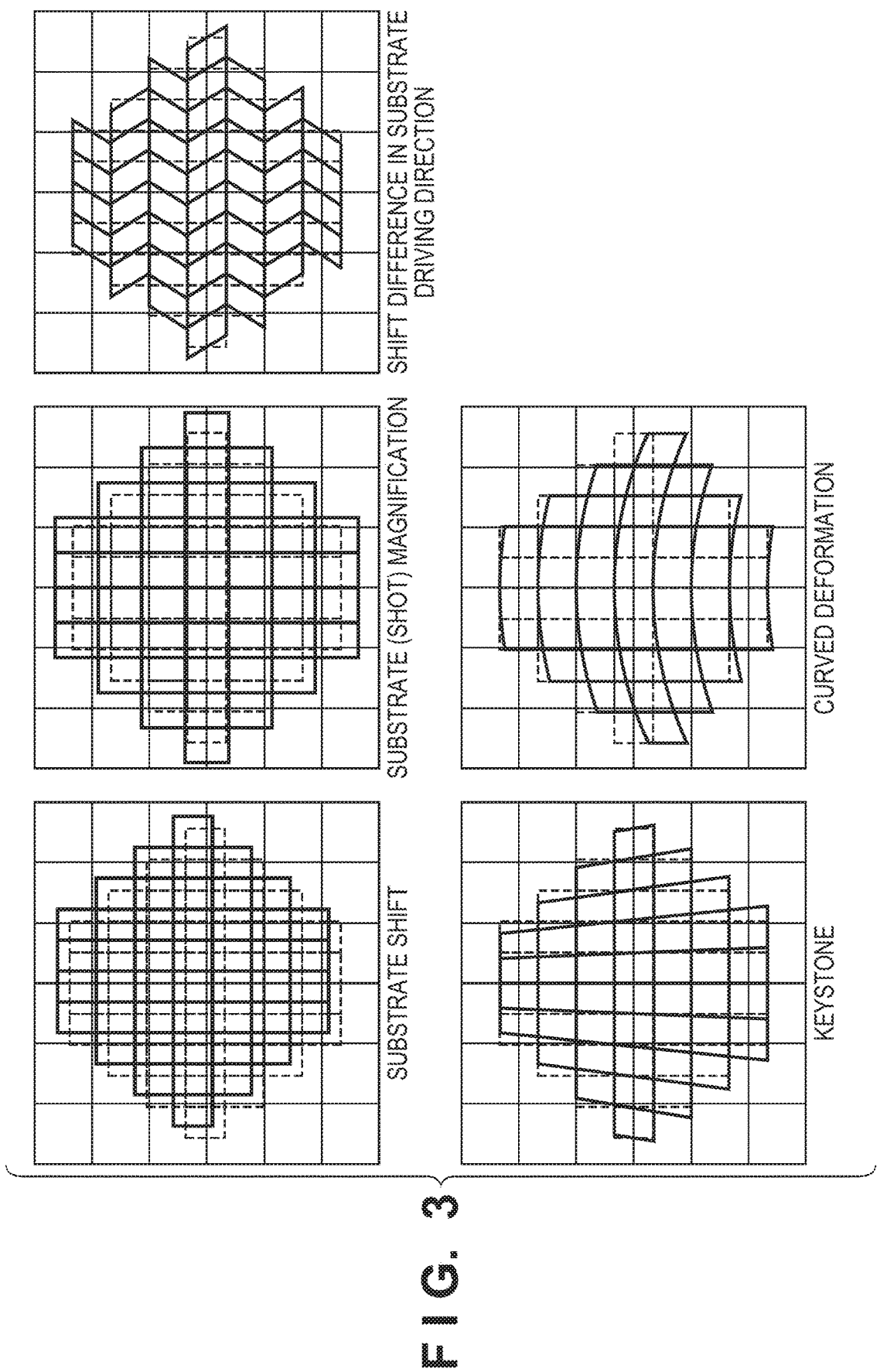
FIG. 3 is a view exemplarily showing components of the substrate deformation amount.

In the exposure apparatus 10, a part of exposure light 8 is absorbed by the substrate 4 and the substrate holder 5, so that the substrate 4 is deformed by an influence of heat generated thereby, and the overlay accuracy can fluctuate with the exposure time (the elapsed time of the job process). The components of the deformation amount of the substrate 4 include a substrate shift, a substrate (shot) magnification, a shift difference in substrate driving direction, keystone deformation, curved deformation, or the like, as shown in FIG. 3.

Figure 2:
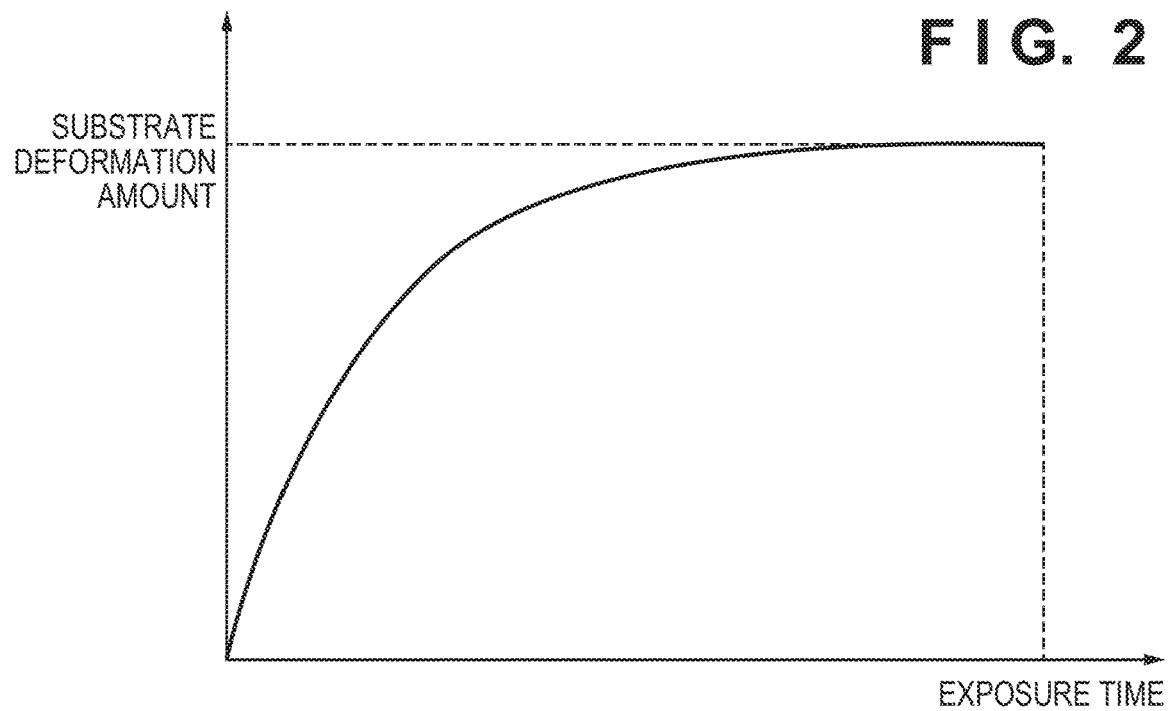
FIG. 2 is a graph showing the relationship between an exposure time and a substrate deformation amount.

For example, as shown in FIG. 2, when an exposure process is performed using the exposure light 8 having a predetermined intensity, the deformation amount of the substrate due to the exposure heat fluctuates exponentially, so that it can be difficult to accurately transfer the pattern of the original 1 to a shot region. Therefore, in this embodiment, the controller 9 corrects, based on the relationship between the elapsed time of the job process and the substrate deformation amount, an overlay error generated due to deformation of the substrate, and exposes the substrate. Here, in the relationship described above, an initial deformation amount corresponding to the residual heat of the substrate holder 5 is given to a substrate conveyed to the substrate holder 5 upon each substrate exchange. A specific example will be described below.

For example, the controller 9 obtains, using a prediction formula, a predicted value of the fluctuation of an overlay error characteristic due to thermal deformation of the substrate with respect to the elapsed time of the job process, and corrects an overlay error based on the predicted value. Correction can be implemented by, for example, at least one of driving of the optical element 3a by the driver 3b of the projection optical system 3, driving of the substrate stage 6, driving of the original stage 2, driving of an optical element of the illumination optical system 7, adjustment of the oscillation frequency of the light source of the illumination optical system 7, and the like. When correction is performed by driving the optical element 3a of the projection optical system 3, the shot magnification of the projection optical system 3 can be corrected by moving the optical element 3a in the optical axis direction based on the predicted value. When correction is performed by driving the substrate stage 6, the controller 9 calculates an optimal exposure position of the substrate 4 based on the predicted value, and reflects this on the driving position of the substrate stage 6. Thus, it is possible to correct the component of the substrate deformation amount including at least one of a substrate shift, a substrate magnification, a shot magnification, a shift difference in substrate driving direction, keystone deformation, and curved deformation. In addition, it is also possible to adjust the temperature of the substrate holder 5 by the adjustment device 12 based on the predicted value of the substrate deformation amount, the predicted value of the temperature of the substrate holder 5, or the temperature of the substrate 4 actually measured by the measurement device 11.

Note that, in addition to the methods described above, correction can be implemented by adjusting the projection optical system 3 by heating the optical element 3a of the projection optical system 3 with infrared rays or the like, deforming the optical element 3a of the projection optical system 3, deforming the reflection surface of a reflection member in the projection optical system 3, or the like. Further, in addition to the methods described above, correction can be implemented by directly correcting the deformation of the substrate 4 by locally heating the substrate 4 with infrared rays or the like, cooling the substrate 4 by locally blowing an air thereto, or the like. Note that the present invention is not limited to a specific correction method. In addition, the exposure apparatus 10 has been described to be configured to project the pattern of the original 1, but the present invention is applicable to a so-called maskless exposure apparatus which uses no original.

The prediction formula of the fluctuation of the overlay error characteristic according to this embodiment will be described below. In this embodiment, the substrate deformation amount upon performing a job process in which exposure is performed on each of a plurality of substrates while exchanging the substrate is predicted. In such a job process, exposure on a substrate (each shot region thereon) and a substrate exchange are repeated. The relationship between the elapsed time of the job process and the substrate deformation amount is represented by a heating model to be applied at the time of exposure on a substrate (each shot region thereof) and a cooling model to be applied at the time of a substrate exchange.

The heating model is expressed by a following equation:

$$\varphi_c(t_c) = \varphi_{ini\text{-}cool} + \exp(t_c/K_c) \quad (4)$$

where $\varphi_h$ is a substrate deformation amount (predicted value), $t_h$ is an exposure time, $I_o$ is a saturated deformation amount, $\varphi_{ini\text{-}heat}$ is an initial deformation amount upon heating, and $K_h$ is a time constant upon heating.

The cooling model is expressed by a following equation:

$$\varphi_c(t_c) = \varphi_{ini\text{-}cool} + \exp(t_c/K_c) \quad (2)$$

where $\varphi_c$ is a substrate deformation amount (predicted value), $t_c$ is an exposure stop time, $\varphi_{ini\text{-}cool}$ is an initial deformation amount upon cooling, and $K_c$ is a time constant upon cooling.

The heating model formula expressed by equation (1) reflects the fluctuation of the overlay error during irradiation of the substrate 4 with exposure light. The cooling model formula expressed by equation (2) reflects the fluctuation of the overlay error due to substrate expansion in a state in which irradiation of the substrate 4 with exposure light is stopped, that is, the fluctuation of the overlay error after the exposure ends. $I_o$ is the saturated deformation amount of the substrate deformation amount (the substrate shift, the substrate magnification, the shot magnification, the shift difference in substrate driving direction, the keystone deformation, or the curved deformation) due to an influence of heat generated by exposure on the substrate. This saturated deformation amount can vary in accordance with the illuminance, the transmittance of the original, the exposure angle of view, and the like, so that it is determined in advance by an exposure experiment or calculation. $t_h$ is the exposure time assuming the time immediately before the exposure on the first shot region of each substrate to be a reference ($t_h$=0), and equation (1) is a model for predicting the substrate deformation amount by obtaining $t_h$ each time exposure is performed on each shot region. $t_c$ is the exposure stop time assuming the time immediately after the exposure on the last shot region of each substrate to be a reference ($t_c$=0), and equation (2) is a model for predicting the substrate deformation amount by obtaining the cooling time $t_c$ during an exposure waiting time.

Each of $\varphi_{ini\text{-}heat}$ and $\varphi_{ini\text{-}cool}$ indicates the initial condition (initial deformation amount upon heating or initial deformation amount upon cooling) of the model. The initial deformation amount can be an amount corresponding to the residual heat of the substrate holder at the time of a substrate exchange. When a substrate exposure operation and a substrate exchange operation are performed alternately, the heating model and the cooling model are applied alternately. Thus, in this embodiment, the initial deformation amount upon heating $\varphi_{ini\text{-}heat}$ of the heating model is determined based on the final predicted value of the substrate deformation amount obtained by the immediately previously applied cooling model. In addition, the initial deformation amount upon cooling ini-cool of the cooling model is determined based on the final predicted value of the substrate deformation amount obtained by the immediately previously applied heating model.

Figure 4A:
FIG. 4A is a graph showing the relationship between the exposure time (the elapsed time of a job process) and the substrate deformation amount according to the embodiment.
Figure 4B:
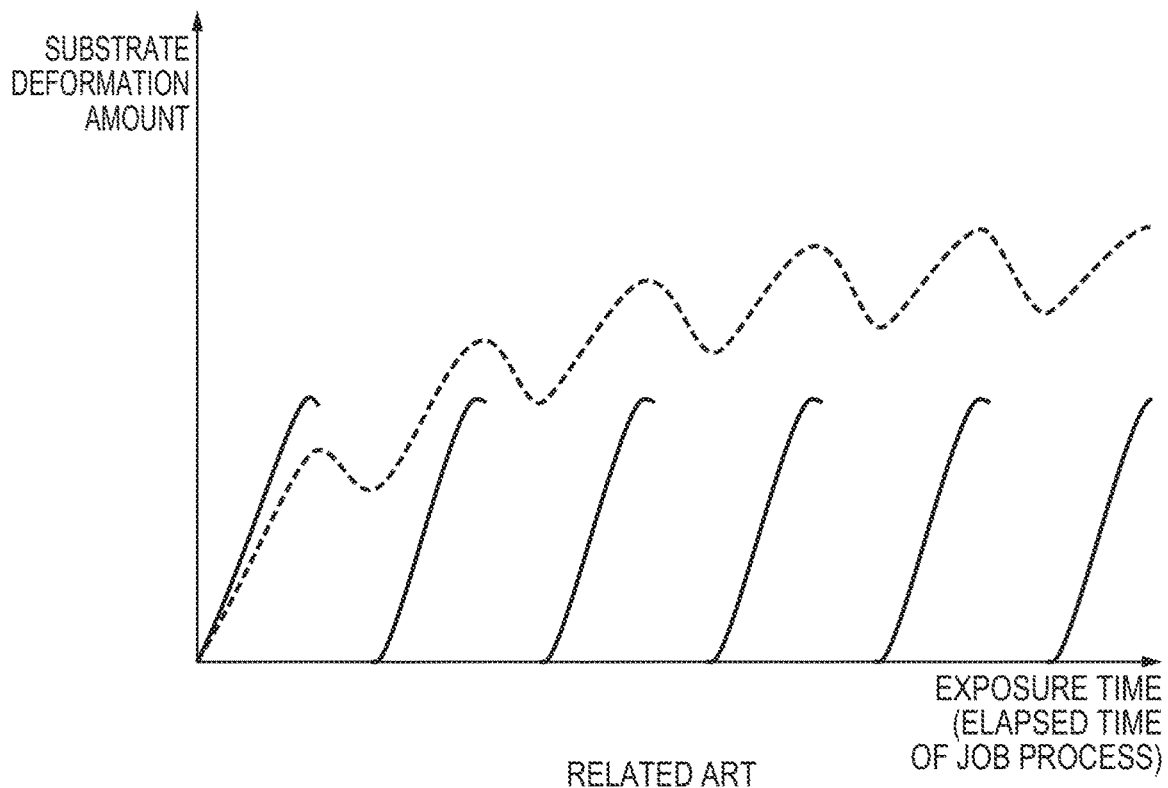
FIG. 4B is a graph showing the relationship between the exposure time (the elapsed time of a job process) and the substrate deformation amount according to a related art.

FIG. 4A is a graph showing the relationship between the exposure time (the elapsed time of a job process) and the substrate deformation amount in accordance with the above-described models according to this embodiment, and FIG. 4B is a graph conceptually showing the relationship between the exposure time (the elapsed time of a job process) and the substrate deformation amount according to a related art.

While exposure is repeated for each shot region of one substrate, the substrate deformation amount increases due to heat input. When the exposure is interrupted, the substrate deformation amount decreases from that point of time by cooling. When the exposure is restarted, the substrate deformation amount increases again. The graph of FIG. 4A shows a case in which this relationship is applied to a case in which exposure is performed on a plurality of substrates while exchanging the substrate. In the graph of FIG. 4A, it can be considered that each period in which the substrate deformation amount increases corresponds to a period of exposure on each substrate, and each period in which the substrate deformation amount decreases corresponds to a period of a substrate exchange.

In the related art shown in FIG. 4B, it is assumed that the exposure heat is recovered by exchanging the substrate so that there is no initial deformation amount of each substrate. However, in practice, due to an influence of the residual heat of the substrate holder 5 during the exposure on the preceding substrate, the initial condition differs even under the same exposure condition, so that the substrate deformation amount during the exposure process is different for each substrate. Therefore, the model according to this embodiment considers the initial deformation amount for each substrate as shown in FIG. 4A. A solid line in each graph indicates the deformation amount predicted by each model, and a broken line indicates the actual deformation amount.

At the time of substrate exposure, prediction is performed in accordance with heating model formula (1). However, since the model formula depends on the initial condition $\varphi_{ini\text{-}heat}$, the increase in deformation amount per unit time differs depending on the magnitude of the $\varphi_{ini\text{-}heat}$ at each substrate exposure. Cooling model formula (2) used at the time of non-exposure such as a substrate exchange also depends on the initial condition $\varphi_{ini\text{-}cool}$, so that similar to equation (1), the decrease in deformation amount per unit time differs depending on the initial condition. As can be seen from comparison between FIGS. 4A and 4B, the model according to this embodiment more successfully predicts the actual deformation amount, so that it can decrease the overlay error due to thermal expansion of the substrate.

Figure 5:
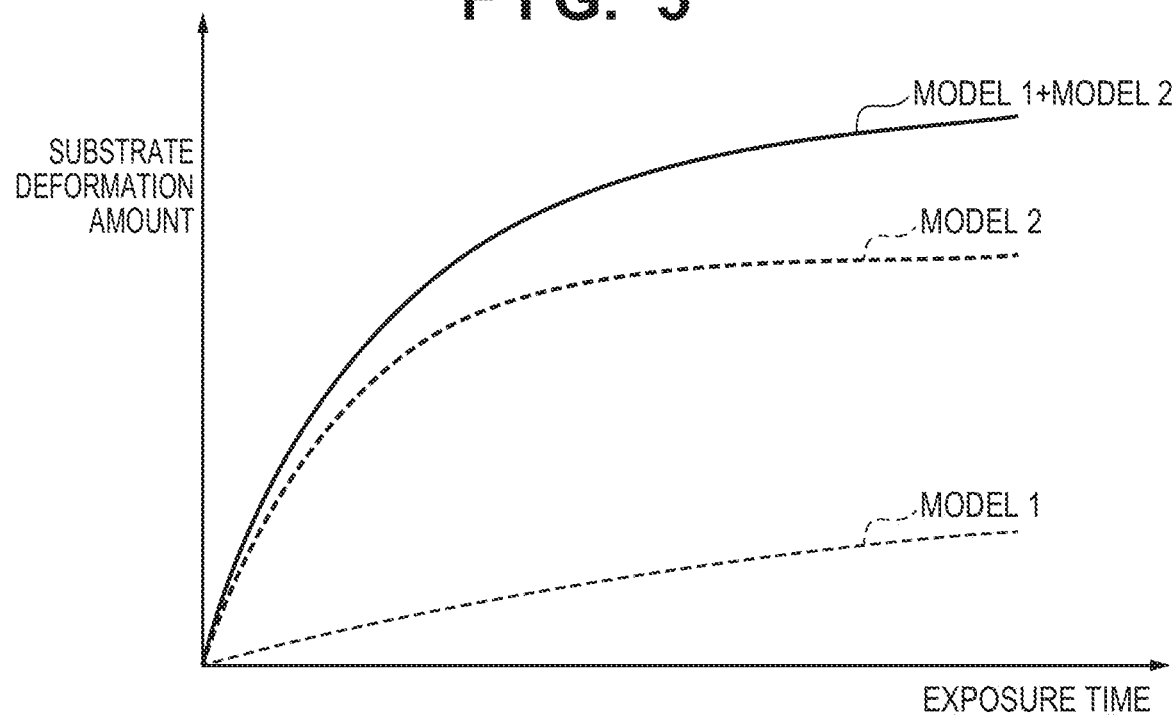
FIG. 5 is a graph showing an example of the temporal characteristic of a heating model obtained by linear overlay of a plurality of model formulas.

When the change amount of the component of the substrate deformation amount depends on a plurality of factors, the substrate deformation amount may not be modeled with high accuracy using only the time constants $K_c$ and $K_h$. Therefore, each of the heating model and the cooling model may be expressed by a model formula obtained by linear overlay of a plurality of model formulas having different coefficients. FIG. 5 shows an example of the temporal characteristic of a heating model obtained by linear overlay of a plurality of model formulas (a model 1 and a model 2) having different coefficients.

Second Embodiment

In the second embodiment, a substrate temperature is predicted, and a substrate deformation amount is predicted based on the predicted substrate temperature. The relationship (first relationship) between the elapsed time of a job process and the substrate temperature is represented by a heating model to be applied at the time of exposure on a substrate (each shot region thereof) and a cooling model to be applied at the time of a substrate exchange.

The heating model is expressed by a following equation:

$$\varphi_h(t_h) = T_o - (T_o - \varphi_{ini\text{-}heat}) \div \exp(t_h/K_h) \quad (3)$$

where $\varphi_h$ is a substrate temperature (predicted value), $t_h$ is an exposure time, $T_o$ is a saturated temperature, $\varphi_{ini\text{-}heat}$ is an initial temperature upon heating, and $K_h$ is a time constant upon heating.

The cooling model is expressed by a following equation:

$$\varphi_c(t_c) = \varphi_{ini\text{-}cool} \div \exp(t_c/K_c) \quad (4)$$

where $\varphi_c$ is a substrate temperature (predicted value), $t_c$ is an exposure stop time, $\varphi_{ini\text{-}cool}$ is an initial temperature upon cooling, and $K_c$ is a time constant upon cooling.

The heating model formula expressed by equation (3) represents the fluctuation of the substrate temperature during irradiation of a substrate 4 with exposure light. The cooling model formula expressed by equation (4) represents the fluctuation of the substrate temperature in a state in which irradiation of the substrate 4 with exposure light ends. $T_o$ is a coefficient of the temperature fluctuation due to exposure on the substrate, and determined in advance by an exposure experiment or calculation. In addition, the relationship (second relationship) between the substrate temperature and the substrate deformation amount (the substrate shift, the substrate magnification, the shot magnification, the shift difference in substrate driving direction, the keystone deformation, or the curved deformation) is obtained in advance. Based on the relationship, a controller 9 predicts the substrate deformation amount from the predicted temperature, and performs an exposure process while correcting an overlay error based on the predicted substrate deformation amount. $t_h$ is the exposure time assuming the time immediately before the exposure on the first shot region of each substrate to be a reference ($t_h$=0), and equation (3) is a model for predicting the substrate temperature by obtaining $t_h$ each time exposure is performed on each shot region. $t_c$ is the exposure stop time assuming the time immediately after the exposure on the last shot region of each substrate to be a reference ($t_c$=0), and equation (4) is a model for predicting the substrate temperature by obtaining the cooling time $t_c$ during an exposure waiting time.

Each of $\varphi_{ini\text{-}heat}$ and $\varphi_{ini\text{-}cool}$ indicates the initial condition (initial temperature upon heating or initial temperature upon cooling) of the model. The initial temperature can be a temperature corresponding to the residual heat of the substrate holder at the time of a substrate exchange. When a substrate exposure operation and a substrate exchange operation are performed alternately, the heating model and the cooling model are applied alternately. Thus, in this embodiment, the initial temperature upon heating $\varphi_{ini\text{-}heat}$ of the heating model is determined based on the final predicted value of the substrate temperature obtained by the immediately previously applied cooling model. In addition, the initial temperature upon cooling $\varphi_{ini\text{-}cool}$ of the cooling model is determined based on the final predicted value of the substrate temperature obtained by the immediately previously applied heating model.

Figure 6:
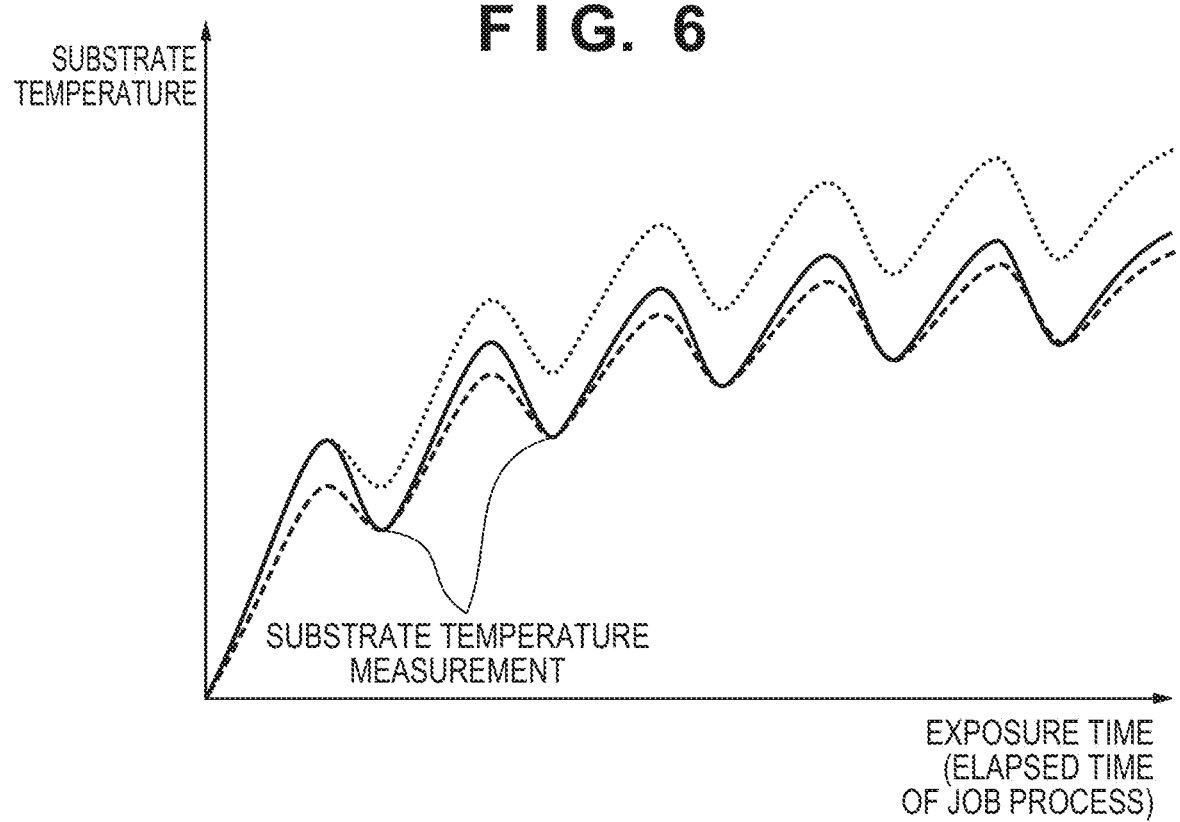
FIG. 6 is a graph showing an effect of calibrating the model based on actually measured temperatures.

The controller 9 may calibrate the initial temperature upon heating $\varphi_{ini\text{-}heat}$ of the heating model formula based on an actual measurement result obtained by a measurement device 11. This enables higher accurate correction of an overlay error. FIG. 6 is a graph showing the effect obtained when the measurement device 11 measures the temperature at a timing of starting a substrate exchange and the model is sequentially calibrated. In FIG. 6, a dotted line indicates the substrate temperature predicted by a model without calibration, a broken line indicates the actual measured value obtained by the measurement device 11, and a solid line indicates the substrate temperature calibrated based on the actual measured value. It can be seen that the calibrated substrate temperature model is closer to the actual measured value.

Note that in this embodiment, it has been described that the temperature of the substrate 4 is measured using the measurement device 11, but the measurement device 11 may be configured to measure the temperature of a substrate holder 5.

In addition, when a change of the substrate temperature depends on a plurality of factors, the change of the substrate temperature may not be modeled with high accuracy using only the time constants $K_c$ and $K_h$. Therefore, each of the heating model and the cooling model may be expressed by a model formula obtained by linear overlay of a plurality of model formulas having different coefficients.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described exposure apparatus on a photosensitive agent applied on a substrate (a step of exposing the substrate), and a step of developing the substrate on which the latent pattern has been formed in the above step. In addition, the manufacturing method includes other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-093919, filed May 17, 2019, which is hereby incorporated by reference herein in its entirety.

What is claimed is:

1. An exposure apparatus that performs a job process, in which exposure of a substrate and a substrate exchange are repeated, comprising: a substrate holder configured to hold a substrate; and a controller configured to control the job process, wherein the controller corrects, based on a relationship between an elapsed time of the job process and a substrate deformation amount, an overlay error generated due to deformation of the substrate, and exposes the substrate, wherein the relationship is represented by a heating model to be applied at the time of exposure of the substrate and a cooling model to be applied at the time of a substrate exchange, wherein the heating model represents a substrate deformation amount during irradiation of the substrate with exposure light, based on a saturated deformation amount, an initial deformation amount upon heating, an exposure time, and a time constant upon heating, wherein the cooling model represents a substrate deformation amount with the exposure light being stopped, based on an initial deformation amount upon cooling, an exposure stop time, and a time constant upon cooling, and wherein the initial deformation amount upon heating is determined based on a final predicted value of the substrate deformation amount obtained by the immediately previously applied cooling model, and the initial deformation amount upon cooling is determined based on a final predicted value of the substrate deformation amount obtained by the immediately previously applied heating model.

2. The apparatus according to claim 1, wherein the heating model is expressed by $$\varphi_h(t_h) = I_o - (I_o - \varphi_{ini\text{-}heat}) \div \exp(t_h/K_h)$$

where $\varphi_h$ is the substrate deformation amount, $t_h$ is an exposure time, $I_o$ is the saturated deformation amount, $\varphi_{ini\text{-}heat}$ is the initial deformation amount upon heating, and $K_h$ is the time constant upon heating, and the cooling model is expressed by $$\varphi_c(t_c) = \varphi_{ini\text{-}cool} \div \exp(t_c/K_c)$$

where $\varphi_c$ is the substrate deformation amount, $t_c$ is the exposure stop time, $\varphi_{ini\text{-}cool}$ is the initial deformation amount upon cooling, and $K_c$ is the time constant upon cooling.

3. The apparatus according to claim 2, wherein each of the heating model and the cooling model is expressed by a model formula obtained by linear overlay of a plurality of model formulas having different coefficients.

4. The apparatus according to claim 1, wherein a component of the substrate deformation amount includes at least one of a substrate shift, a substrate magnification, a shot magnification, a shift difference in substrate driving direction, keystone deformation, and curved deformation.

5. The apparatus according to claim 1, further comprising:
an original stage configured to hold an original;
the substrate holder configured to hold the substrate;
a substrate stage configured to support the substrate holder;

an illumination optical system configured to illuminate the original held by the original stage; and a projection optical system configured to project a pattern of the original illuminated by the illumination optical system onto the substrate held by the substrate holder, wherein the controller corrects the overlay error by performing at least one of driving of an optical element of the projection optical system, driving of the substrate stage, driving of the original stage, driving of an optical element of the illumination optical system, and adjustment of an oscillation frequency of a light source of the illumination optical system.

6. An article manufacturing method comprising:

exposing a substrate using an exposure apparatus defined in claim 1, and developing the exposed substrate, wherein an article is manufactured from the developed substrate.

7. The apparatus according to claim 1, wherein in the relationship, the substrate conveyed to the substrate holder upon a substrate exchange is given an initial deformation amount corresponding to residual heat of the substrate holder at the time of the substrate exchange.

8. An exposure apparatus that performs a job process, in which exposure of a substrate and a substrate exchange are repeated, comprising:

a substrate holder configured to hold a substrate; and a controller configured to control the job process, wherein the controller corrects, based on a first relationship between an elapsed time of the job process and a substrate temperature and a second relationship between the substrate temperature and a substrate deformation amount, an overlay error generated due to deformation of the substrate, and exposes the substrate, and wherein the first relationship is represented by a heating model to be applied at the time of exposure of the substrate and a cooling model to be applied at the time of a substrate exchange, wherein the heating model represents a substrate temperature during irradiation of the substrate with exposure light, based on a saturated temperature, an initial temperature upon heating, an exposure time, and a time constant upon heating, wherein the cooling model represents a substrate temperature with the exposure light being stopped, based on an initial temperature upon cooling, an exposure stop time, and a time constant upon cooling, and wherein the initial temperature upon heating is determined based on a final predicted value of the substrate temperature obtained by the immediately previously applied cooling model, and the initial temperature upon cooling is determined based on a final predicted value of the substrate temperature obtained by the immediately previously applied heating model.

9. The apparatus according to claim 8, wherein the heating model is expressed by $$\varphi_h(t_h)=T_o-(T_o-\varphi_{ini-heat})\div\exp(t_h/K_h)$$

where $\varphi_h$ is the substrate temperature, $t_h$ is the exposure time, $T_o$ is the saturated temperature, $\varphi_{ini-heat}$ is the initial temperature upon heating, and $K_h$ is the time constant upon heating, and the cooling model is expressed by $$\varphi_c(t_c)=\varphi_{ini-cool}\div\exp(t_c/K_c)$$

where $\varphi_c$ is the substrate temperature, $t_c$ is the exposure stop time, $\varphi_{ini-cool}$ is the initial temperature upon cooling, and $K_c$ is the time constant upon cooling.

10. The apparatus according to claim 9, wherein each of the heating model and the cooling model is expressed by a model formula obtained by linear overlay of a plurality of model formulas having different coefficients.

11. The apparatus according to claim 8, further comprising a measurement device configured to measure a temperature of the substrate, wherein the controller calibrates the initial temperature upon heating based on the temperature measured by the measurement device at a timing of starting a substrate exchange.

12. An article manufacturing method comprising:

exposing a substrate using an exposure apparatus defined in claim 8, and developing the exposed substrate, wherein an article is manufactured from the developed substrate.

13. The apparatus according to claim 8, wherein in the first relationship, the substrate conveyed to the substrate holder upon a substrate exchange is given an initial temperature corresponding to residual heat of the substrate holder at the time of the substrate exchange.

14. An exposure apparatus that performs a job process, in which exposure of a substrate and a substrate exchange are repeated, comprising:

a substrate holder configured to hold a substrate; and a controller configured to control the job process, wherein the controller corrects, based on a relationship between an elapsed time of the job process and a substrate deformation amount, an overlay error generated due to deformation of the substrate, and exposes the substrate, wherein in the relationship, the substrate conveyed to the substrate holder upon a substrate exchange is given an initial deformation amount corresponding to residual heat of the substrate holder at the time of the substrate exchange, and wherein the relationship is represented by a heating model to be applied at the time of substrate exposure and a cooling model to be applied at the time of a substrate exchange, the heating model is expressed by $$\varphi_h(t_h)=I_o-(I_o-\varphi_{ini-heat})\div\exp(t_h/K_h)$$

where $\varphi_h$ is a substrate deformation amount, $t_h$ is an exposure time, $I_o$ is a saturated deformation amount, $\varphi_{ini-heat}$ is an initial deformation amount upon heating, and $K_h$ is a time constant upon heating, and the cooling model is expressed by $$\varphi_c(t_c)=\varphi_{ini-cool}\div\exp(t_c/K_c)$$

where $\varphi_c$ is a substrate deformation amount, $t_c$ is an exposure stop time, $\varphi_{ini-cool}$ is an initial deformation amount upon cooling, and $K_c$ is a time constant upon cooling.

15. An article manufacturing method comprising:

exposing a substrate using an exposure apparatus defined in claim 14, and developing the exposed substrate, wherein an article is manufactured from the developed substrate.

16. An exposure apparatus that performs a job process, in which exposure of a substrate and a substrate exchange are repeated, comprising:

a substrate holder configured to hold a substrate; and a controller configured to control the job process, wherein the controller corrects, based on a first relationship between an elapsed time of the job process and a substrate temperature and a second relationship between the substrate temperature and a substrate deformation amount, an overlay error generated due to deformation of the substrate, and exposes the substrate, wherein in the first relationship, the substrate conveyed to the substrate holder upon a substrate exchange is given an initial temperature corresponding to residual heat of the substrate holder at the time of the substrate exchange, and wherein the first relationship is represented by a heating model to be applied at the time of substrate exposure and a cooling model to be applied at the time of a substrate exchange, the heating model is expressed by $$\varphi_h(t_h) = T_o - (T_o - \varphi_{ini\text{-}heat}) \div \exp(t_h/K_h)$$

where $\varphi_h$ is a substrate temperature, $t_h$ is an exposure time, $T_o$ is a saturated temperature, $\varphi_{ini\text{-}heat}$ is an initial temperature upon heating, and $K_h$ is a time constant upon heating, and the cooling model is expressed by $$\varphi_c(t_c) = \varphi_{ini\text{-}cool} \div \exp(t_c/K_c)$$

where $\varphi_c$ is a substrate temperature, $t_c$ is an exposure stop time, $\varphi_{ini\text{-}cool}$ is an initial temperature upon cooling, and $K_c$ is a time constant upon cooling.

17. An article manufacturing method comprising:
   exposing a substrate using an exposure apparatus defined in claim 16, and
   developing the exposed substrate,
   wherein an article is manufactured from the developed substrate.

* * * * *